United States Patent
Chen et al.

(10) Patent No.: US 7,477,214 B2
(45) Date of Patent: Jan. 13, 2009

(54) SOFT SWITCHING OF HIGH-SIDE SWITCHES OF PDP SCAN ICS

(75) Inventors: Bi-Hsien Chen, Ping-Tung Hsien (TW); Yi-Min Huang, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 470 days.

(21) Appl. No.: 11/422,887

(22) Filed: Jun. 8, 2006

(65) Prior Publication Data

US 2006/0284798 A1 Dec. 21, 2006

Related U.S. Application Data

(60) Provisional application No. 60/595,297, filed on Jun. 21, 2005.

(51) Int. Cl.
G09G 3/28 (2006.01)

(52) U.S. Cl. .......................................... 345/66; 345/63

(58) Field of Classification Search .................. 345/37, 345/41, 42, 60, 63, 66, 211; 313/567; 315/169.3, 315/169.4
See application file for complete search history.

(56) References Cited

U.S. PATENT DOCUMENTS

| | | | | |
|---|---|---|---|---|
| 6,628,275 B2 * | 9/2003 | Vossen et al. | ............... | 345/211 |
| 6,680,581 B2 * | 1/2004 | Lee et al. | ................. | 315/169.3 |
| 6,768,270 B2 * | 7/2004 | Chae | ....................... | 315/169.3 |
| 6,781,322 B2 * | 8/2004 | Onozawa et al. | ......... | 315/169.3 |
| 6,933,679 B2 * | 8/2005 | Lee et al. | ................. | 315/169.4 |
| 6,961,031 B2 * | 11/2005 | Lee et al. | ...................... | 345/60 |
| 7,023,139 B2 * | 4/2006 | Lee et al. | ................. | 315/169.1 |
| 7,027,010 B2 * | 4/2006 | Lee | ............. | 345/60 |
| 7,123,219 B2 * | 10/2006 | Lee | ............. | 345/76 |
| 7,176,854 B2 * | 2/2007 | Lee et al. | ...................... | 345/60 |
| 7,385,569 B2 * | 6/2008 | Chen et al. | .................... | 345/66 |
| 2003/0173905 A1 * | 9/2003 | Lee et al. | ................. | 315/169.3 |
| 2003/0193454 A1 * | 10/2003 | Lee et al. | ...................... | 345/63 |
| 2004/0012546 A1 * | 1/2004 | Takagi et al. | ................... | 345/60 |
| 2004/0104866 A1 * | 6/2004 | Sano et al. | .................... | 345/60 |
| 2004/0135746 A1 * | 7/2004 | Lee et al. | ...................... | 345/60 |
| 2005/0179621 A1 * | 8/2005 | Kang et al. | ................... | 345/60 |
| 2006/0238447 A1 * | 10/2006 | Chen | .......................... | 345/60 |
| 2006/0267874 A1 * | 11/2006 | Chen et al. | .................... | 345/68 |

FOREIGN PATENT DOCUMENTS

CN 1412734 A 4/2003

* cited by examiner

*Primary Examiner*—Ricardo L Osorio
(74) *Attorney, Agent, or Firm*—Winston Hsu

(57) ABSTRACT

A method of switching a high-side switch of a plasma display panel (PDP) scan circuit in zero-voltage-switching mode. The scan circuit contains a high-side switch and a low-side switch. By controlling the voltage potential difference across the high-side switch, the high-side switch of the PDP scan circuit can operate using soft switching or in zero-voltage-switching (ZVS) mode. The switching loss of scan ICs and the switching noise from scan ICs will therefore be reduced.

5 Claims, 2 Drawing Sheets

ings.

SOFT SWITCHING OF HIGH-SIDE SWITCHES OF PDP SCAN ICS

CROSS REFERENCE TO RELATED APPLICATIONS

This application claims the benefit of the filing date of U.S. provisional patent application No. 60/595,297, filed Jun. 21, 2005, the contents of which are hereby incorporated by reference.

BACKGROUND OF THE INVENTION

1. Field of the Invention P The present invention relates to a switching operation of scan ICs in a plasma display panel (PDP), and more particularly, to a soft switching operation used in scan ICs of a PDP for reducing switching noise.

2. Description of the Prior Art

In recent years, plasma display panels (PDP) have been actively developed due to the properties of high luminance, high luminous efficiency, and wide viewing angle. The PDP is a flat panel display that uses plasma generated by gas discharge to display characters or images, and it includes, according to its size, more than several scores to millions of pixels arranged in a matrix pattern.

A PDP has two parallel sheets of glass, which enclose a gas mixture. A plurality of the first sustain electrodes, referred to as X electrodes, and a plurality of the second sustain electrodes, referred to as Y electrodes, are formed in parallel on the front substrate. A plurality of address electrodes are formed on the rear substrate. The voltages are applied to the electrodes to discharge the gas mixture. Scan ICs are coupled to Y electrodes and driving circuits for scanning the data into the PDP. That is, the driving circuits can couple to Y electrodes via the intermediate scan ICs.

In order to reduce the switching losses of scan ICs and to decrease the switching noise from scan ICs, high-side switches of PDP scan ICs should be switched in zero-voltage-switching (ZVS) mode or should approach ZVS operation.

SUMMARY OF THE INVENTION

It is therefore an objective of the claimed invention to provide a method of switching a high-side switch of a plasma display panel (PDP) scan circuit in zero-voltage-switching mode. The scan circuit contains a high-side switch electrically connected between a first node and a Y electrode, a first diode having a cathode electrically connected to the first node and an anode electrically connected to the Y electrode, a low-side switch electrically connected between the Y electrode and a second node, and a second diode having a cathode electrically connected to the Y electrode and an anode electrically connected to the second node. The method includes turning off the high-side switch and turning on the low-side switch for providing both the Y electrode and the second node with a first voltage level; turning off the low-side switch after both the Y electrode and the second node have reached the first voltage level; driving the voltage potential of the second node to be a second voltage level while maintaining the voltage potential of the Y electrode at the first voltage level, wherein a difference between the voltage potentials of first voltage level and the second voltage level is greater than the difference between the voltage potentials of the voltage level of the first node and the second voltage level, thereby enabling the first diode to turn on and provide the Y electrode with the voltage level of the first node; and turning on the high-side switch in zero-voltage-switching mode.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a method of switching PDP scan ICs in ZVS mode. The method of approaching or reaching ZVS operation involves making parasitical or added diodes of high-side switches of PDP scan ICs be conducted before high-side switches are turned on.

Figure 1:
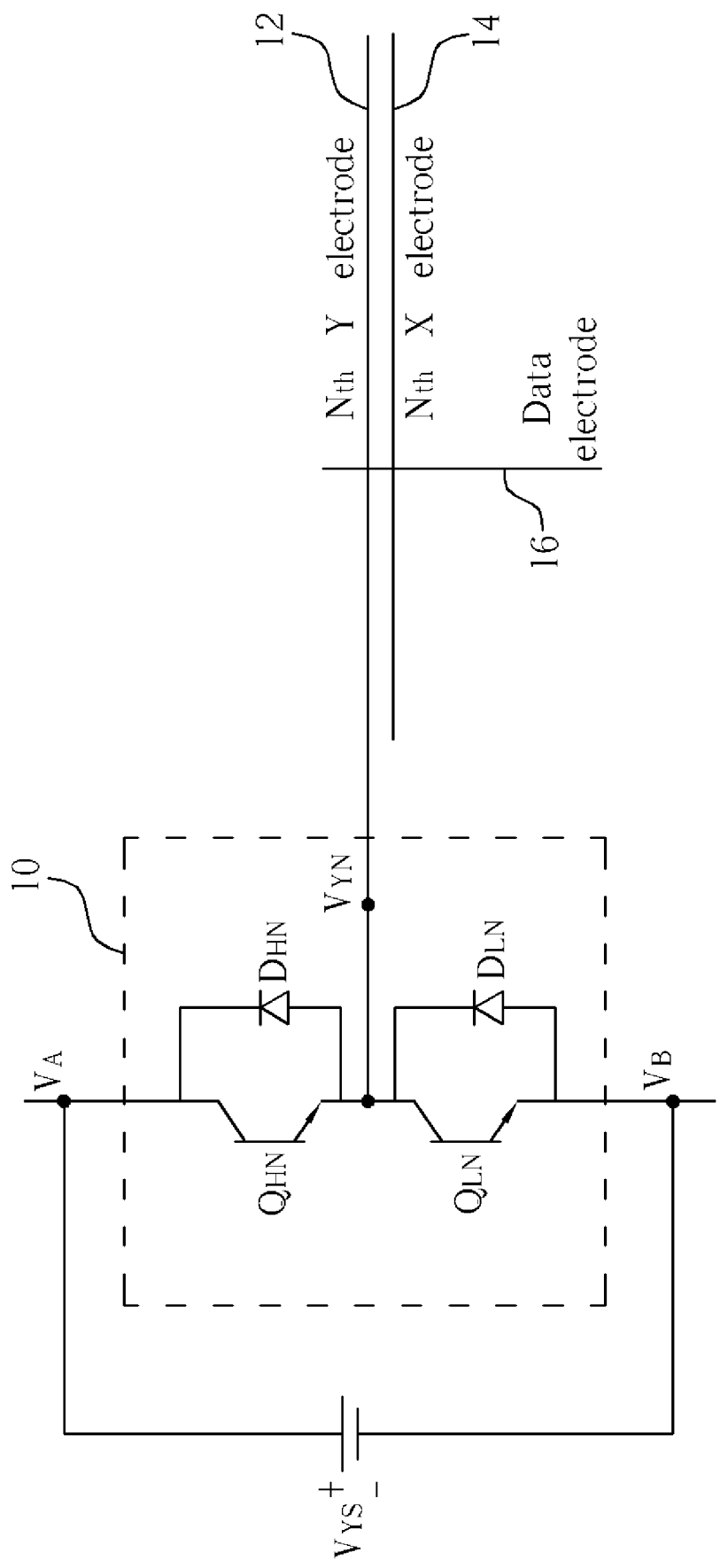
FIG. 1 which is a circuit diagram of a scan IC which utilizes the present invention method.

Please refer to FIG. 1, which is a circuit diagram of a scan IC 10 which utilizes the present invention method. The scan IC 10 corresponds to an Nth Y electrode 12 of a PDP. Also shown is an Nth X electrode 14 and a data electrode 16 corresponding to the scan IC 10. The scan IC 10 comprises a high-side switch $Q_{HN}$ and a low-side switch $Q_{LN}$ corresponding to the Nth Y electrode 12. The scan IC 10 also contains diodes $D_{HN}$ and $D_{LN}$, which can be added diodes or can be parasitical diodes. The reference symbols $V_A$, $V_B$, and $V_{YN}$ represent the voltage potentials at node A, node B, and the Nth Y electrode 12. The voltage potential $V_{YS}$, which is coupled to PDP scan ICs 10, is the difference between the voltage potential $V_A$ and the voltage potential $V_B$. The voltage potentials of $V_A$, $V_B$ and $V_{YN}$ are variable with the different operation modes of the scan IC 10.

Figure 2:
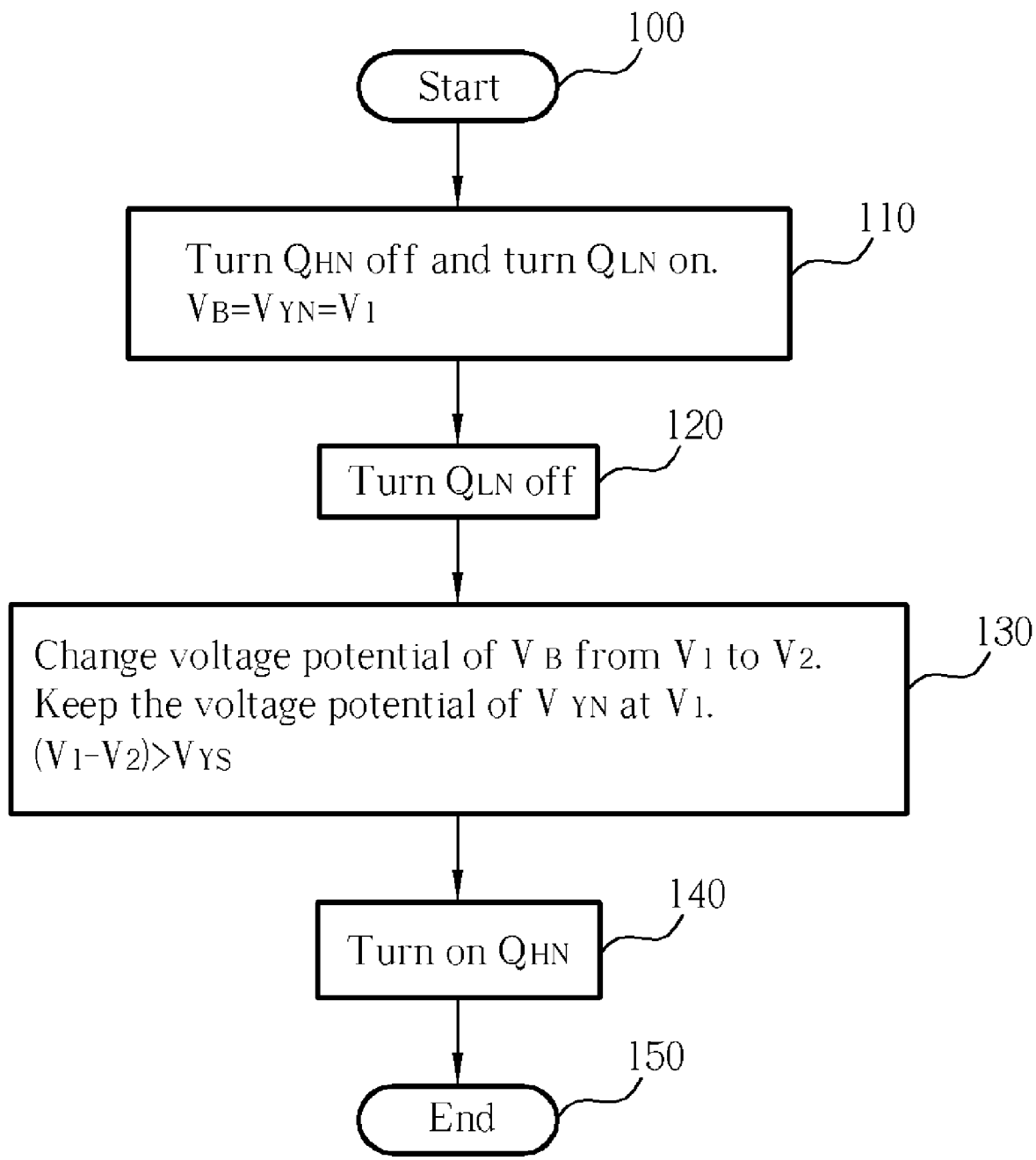
FIG. 2, which is a flowchart of the present invention method of operating the scan IC for switching the high-side switch $Q_{HN}$ in ZVS mode.

Please refer to FIG. 2, which is a flowchart of the present invention method of operating the scan IC 10 for switching the high-side switch $Q_{HN}$ in ZVS mode. Steps in the flowchart will be explained below.

Step 100: Start.

Step 110: Turn the high-side switch $Q_{HN}$ off and turn the low-side switch $Q_{LN}$ on. At this time, the voltages $V_B$ and $V_{YN}$ have the same voltage potential $V_1$. When the voltage potential of $V_B$ is $V_1$, the voltage potential of $V_A$ is $(V_1+V_{YS})$ and the difference between voltage potentials $V_{YN\,and\,VA}$ $(V_{YN}-V_A)$ is equal to $(-V_{YS})$, which is negative. Therefore, at this time, the diode $D_{HN}$ is reversed and does not allow current to flow through it.

Step 120: Turn off the low-side switch $Q_{LN}$.

Step 130: The voltage $V_B$ is pulled down from voltage potential $V_1$ to voltage potential $V_2$ using a driving circuit, but the voltage potential of $V_{YN}$ is maintained at $V_1$. The voltage potential $V_2$ is selected so that the magnitude of $(V_1-V_2)$ is larger than $V_{YS}$. When the voltage potential of $V_B$ is pulled down to $V_2$, the voltage potential of $V_A$ will be to $(V_2+V_{YS})$ and the difference between voltage potentials $V_{YN}$ and $V_A$ $(V_{YN}-V_A)$ is equal to $(V_1-V_2-V_{YS})$ which is positive because the magnitude of $(V_1-V_2)$ is larger than $V_{YS}$. Since the difference between voltage potentials $V_{YN}$ and $V_A$ $(V_{YN}-V_A)$ is positive, the $D_{HN}$ will be conducted and allow current to flow through it. Therefore, the voltage potential of $V_{YN}$ will follow the voltage potential of $V_A$.

Step 140: Turn on $Q_{HN}$. $Q_{HN}$ operates in ZVS mode since the voltage potential difference between $V_{YN}$ and $V_A$ is zero.

Step 150: End.

In summary, the present invention provides a method of controlling the node voltages of the scan IC 10 so that the high-side switch $Q_{HN}$ can be switched in ZVS mode. Switching the high-side switch $Q_{HN}$ in ZVS mode reduces the switching losses and decreases the switching noise of the scan IC 10. Although a single scan IC has been used for illustration purposes, the present invention is not limited to a single scan IC, and all scan ICs in a PDP could benefit from the present invention method.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of switching a high-side switch of a plasma display panel (PDP) scan circuit in zero-voltage-switching mode, the scan circuit having a high-side switch electrically connected between a first node and a Y electrode, a first diode having a cathode electrically connected to the first node and an anode electrically connected to the Y electrode, a low-side switch electrically connected between the Y electrode and a second node, and a second diode having a cathode electrically connected to the Y electrode and an anode electrically connected to the second node, the method comprising:

turning off the high-side switch and turning on the low-side switch for providing both the Y electrode and the second node with a first voltage level;

turning off the low-side switch after both the Y electrode and the second node have reached the first voltage level;

driving the voltage potential of the second node to be a second voltage level while maintaining the voltage potential of the Y electrode at the first voltage level, wherein a difference between the voltage potentials of first voltage level and the second voltage level is greater than the difference between the voltage potentials of the voltage level of the first node and the second voltage level, thereby enabling the first diode to turn on and provide the Y electrode with the voltage level of the first node; and turning on the high-side switch in zero-voltage-switching mode.

2. The method of claim 1, wherein the first and second diodes are parasitic diodes.

3. The method of claim 1, wherein the high-side switch and the low-side switch are transistors.

4. The method of claim 1, wherein the high-side switch and the low-side switch are BJT transistors.

5. The method of claim 1, wherein the high-side switch and the low-side switch are MOSFET transistors.

* * * * *